(12) United States Patent
Xue et al.

(10) Patent No.: US 10,872,984 B2
(45) Date of Patent: Dec. 22, 2020

(54) THIN FILM TRANSISTOR HAVING CHANNEL REGIONS, ARRAY SUBSTRATE, MANUFACTURING METHOD THEREOF AND DISPLAY DEVICE COMPRISING THE SAME

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Jinjin Xue, Beijing (CN); Dawei Shi, Beijing (CN); Haifeng Xu, Beijing (CN); Lu Yang, Beijing (CN); Wentao Wang, Beijing (CN); Lei Yan, Beijing (CN); Lei Yao, Beijing (CN); Fang Yan, Beijing (CN); Xiaowen Si, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days.

(21) Appl. No.: 16/135,511

(22) Filed: Sep. 19, 2018

(65) Prior Publication Data
US 2019/0131318 A1    May 2, 2019

(30) Foreign Application Priority Data

Oct. 27, 2017   (CN) .......................... 2017 1 1026420

(51) Int. Cl.
*H01L 29/786* (2006.01)
*H01L 27/12* (2006.01)
(Continued)

(52) U.S. Cl.
CPC .. *H01L 29/78696* (2013.01); *G02F 1/134309* (2013.01); *G02F 1/136286* (2013.01);
(Continued)

(58) Field of Classification Search
CPC .......... H01L 29/78696; H01L 29/0692–0696; H01L 29/78633; H01L 29/78645;
(Continued)

(56) References Cited

U.S. PATENT DOCUMENTS 9,147,699 B2   9/2015  Park et al.
9,711,540 B2   7/2017  Wang et al.
(Continued)

FOREIGN PATENT DOCUMENTS

CN   104485333 A   4/2015
CN   104751760 A   7/2015
(Continued)

OTHER PUBLICATIONS

The First Chinese Office Action dated Sep. 3, 2019; Appln. No. 201711026420.7.

*Primary Examiner* — Laura M Menz
*Assistant Examiner* — Candice Chan (57) ABSTRACT

A thin-film transistor (TFT), an array substrate, a manufacturing method thereof and a display device are provided. The TFT includes an active layer, a gate electrode, a first source/drain electrode and a second source/drain electrode. The active layer includes a first channel region and a second channel region, a first source/drain area between the first channel region and the second channel region, and a second source/drain area opposite to the first source/drain area through the first channel region or the second channel region. The gate electrode includes a first gate electrode and a second gate electrode which are respectively overlapped with the first channel region and the second channel region.

(Continued)

The first source/drain electrode and the second source/drain electrode are respectively electrically connected with the first source/drain area and the second source/drain area of the active layer.

20 Claims, 8 Drawing Sheets

(51) Int. Cl.
 *G02F 1/1362* (2006.01)
 *G02F 1/1343* (2006.01)
 *H01L 29/06* (2006.01)

(52) U.S. Cl.
 CPC .......... *H01L 27/124* (2013.01); *H01L 27/127* (2013.01); *H01L 27/1225* (2013.01); *H01L 27/1251* (2013.01); *H01L 29/78633* (2013.01); *H01L 29/78645* (2013.01); *G02F 2201/121* (2013.01); *G02F 2201/123* (2013.01); *H01L 29/0692* (2013.01)

(58) Field of Classification Search
 CPC . H01L 27/124; H01L 27/1225; H01L 27/127; H01L 27/1251; H01L 27/1222
 See application file for complete search history.

(56) References Cited

U.S. PATENT DOCUMENTS

2016/0172387 A1\* 6/2016 Wang .................. H01L 27/1255
 257/71
2017/0162641 A1\* 6/2017 Tsuno ............... H01L 29/78648

FOREIGN PATENT DOCUMENTS

CN 205355054 U 6/2016
WO 2016/013264 A1 1/2016

\* cited by examiner

THIN FILM TRANSISTOR HAVING CHANNEL REGIONS, ARRAY SUBSTRATE, MANUFACTURING METHOD THEREOF AND DISPLAY DEVICE COMPRISING THE SAME

CROSS REFERENCE TO RELATED APPLICATIONS

The application claims priority to the Chinese patent application No. 201711026420.7, filed on Oct. 27, 2017 to CHIPA, and entitled "Thin Film Transistor, Array Substrate, Manufacturing Method thereof and Display Device", which is incorporated herein by reference in its entirety.

TECHNICAL FIELD

Embodiments of the present disclosure relate to a thin-film transistor (TFT), an array substrate, a manufacturing method thereof and a display device.

BACKGROUND

In the field of display, thin film transistors (TFTs), as the core of the industry, attracted more and more attention. The TFT technology, for instance, can be applied to various display devices, such as liquid crystal displays (LCDs), organic light-emitting diode (OLED) displays and electronic paper displays and any product or component having the display function, such as a television, a digital camera, a mobile phone, a watch, a tablet PC, a notebook computer or a navigator. In the display device, the TFT, for instance, can function as a switch. For example, under the control of a gate electrode, an external data signal can charge or discharge a pixel electrode in the display device through the TFT.

SUMMARY

At least one embodiment of the present disclosure provides a thin-film transistor (TFT), comprising: active layer including a first channel region and a second channel region, a first source/drain area between the first channel region and the second channel region, and a second source/drain area opposite to the first source/drain area through the first channel region or the second channel region; a gate electrode including a first gate electrode and a second gate electrode. The first gate electrode and the second gate electrode are respectively overlapped with the first channel region and the second channel region; and a first source/drain electrode and a second source/drain electrode being respectively electrically connected with the first source/drain area and the second source/drain area of the active layer.

For example, the second source/drain area includes a first sub-source/drain area and a second sub-source/drain area; and the second source/drain electrode is electrically connected with both the first sub-source/drain area and the second sub-source/drain area.

For example, the TFT further comprises an interlayer insulating layer. The interlayer insulating layer is provided between the active layer and the first source/drain electrode and the second source/drain electrode and provided with a plurality of through holes for the first source/drain electrode and the second source/drain electrode to be respectively electrically connected with the active layer.

For example, the active layer is a closed pattern; and the second source/drain area is provided between the first channel region and the second channel region.

For example, the closed pattern is a circle or a polygon.

For example, the polygon is a rectangle.

For example, the active layer includes material of polycrystalline silicon (poly-Si).

For example, the first gate electrode and the second gate electrode are a same structure.

For example, the TFT adopts top-gate or bottom-gate type.

At least one embodiment of the present disclosure provides an array substrate, comprising the thin film transistor (TFT).

For example, the array substrate further comprises: a pixel electrode electrically connected with one of the first source/drain electrode and the second source/drain electrode; and a common electrode which forms two electrodes of a first capacitor together with the pixel electrode.

For example, the common electrode and the pixel electrode are in different layers.

For example, the array substrate further comprises: a metal layer provided in a same layer as the first source/drain electrode and the second source/drain electrode or the gate electrode, the metal layer being at least partially overlapped with the active layer and configured to form two electrodes of a second capacitor together with the active layer.

For example, the metal layer is electrically connected with the common electrode.

For example, the array substrate further comprises: a light blocking layer at least overlapped with at least one of the first channel region and the second channel region of the active layer.

At least one embodiment of the present disclosure also provides a display device, comprising the array substrate.

At least one embodiment of the present disclosure also provides a method for manufacturing an array substrate, comprising: forming an active layer, in which the active layer includes a first channel region and a second channel region, a first source/drain area between the first channel region and the second channel region, and a second source/drain area opposite to the first source/drain area through the first channel region or the second channel region; forming a gate electrode, in which the gate electrode includes a first gate electrode and the second gate electrode respectively overlapped with the first channel region and the second channel region; and forming a first source/drain electrode and a second source/drain electrode, in which the first source/drain electrode and the second source/drain electrode are respectively connected with the first source/drain area and the second source/drain area of the active layer.

For example, the active layer is a closed pattern; and the second source/drain area is formed between the first channel region and the second channel region.

For example, forming a pixel electrode electrically connected with one of the first source/drain electrode and the second source/drain electrode; and forming a common electrode which form two electrodes of a first capacitor together with the pixel electrode.

For example, forming a metal layer. The metal layer is simultaneously formed with the first source/drain electrode and the second source/drain electrode or the gate electrode, the metal layer is at least partially overlapped with the active layer and forms two electrodes of a second capacitor together with the active layer.

BRIEF DESCRIPTION OF THE DRAWINGS

Embodiments of the present disclosure is described in more detail below with reference to accompanying drawings to allow an ordinary skill in the art to more clearly understand embodiments of the present disclosure, in which.

DETAILED DESCRIPTION

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, one of ordinary in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

A TFT for instance, includes structures, such as a gate electrode, a source electrode, a drain electrode, a gate insulating layer and an active layer. An array substrate, for instance, includes a plurality of subpixel units, and each subpixel unit generally includes at least one TFT. For instance, an array substrate for an LCD panel may be a vertical electrical field type array substrate, a horizontal electrical field type array substrate, etc.

Figure 1:
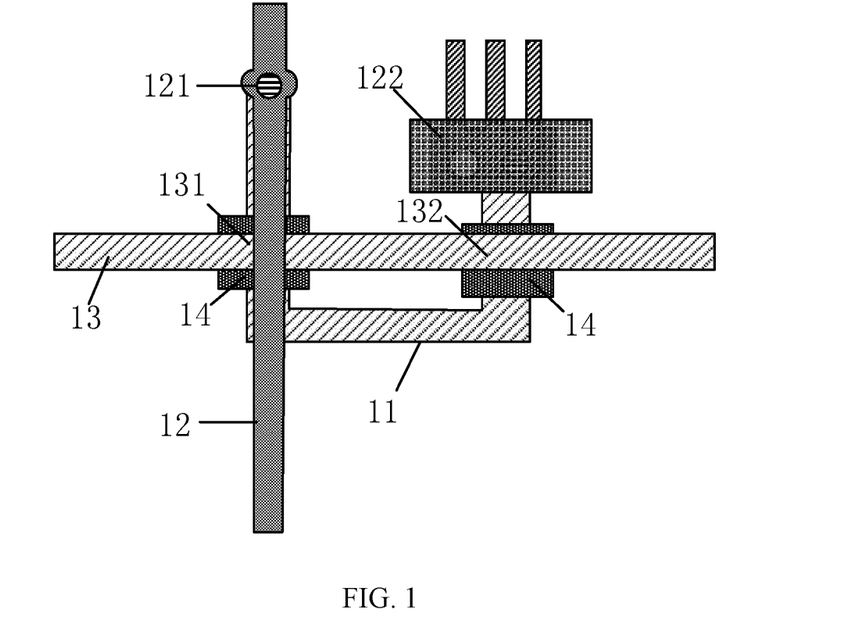
FIG. 1 is a schematically structural plan view of a thin film transistor (TFT)

FIG. 1 is a schematically structural plan view of a thin film transistor (TFT). As shown in the figure. the TFT comprises a first gate electrode 131, a second gate electrode 132, a first source/drain electrode 121, a second source/drain electrode 122, a gate insulating layer 14 and an active layer 11. As shown in FIG. 1, the shape of the active layer 11 of the TFT is "U" shaped, and the first gate electrode 131 and the second gate electrode 132 are respectively overlapped with the active layer 11 through the gate insulating layer 14. For clarity, only partial gate insulating layer at an overlapped position is shown in the figure, but the gate insulating layer, for instance, may cover the entire active layer 11.

The design of the above TFT may present a defect of forming bright spots and/or dark spots in a display panel employing the TFT when some components are damaged. For example, when the TFT in the display panel has the problem that one end of the gate electrode is broken or the active layer is broken, the display panel may have dark spot defect; and when the gate electrode and the active layer in the TFT of the display panel are conducted, for instance, due to the deficiency of the gate insulating layer or interlayer foreign matters between the gate electrode and the active layer, the display panel may have bright spot defect. Bright spots and/or dark spots are a common undesirable phenomenon in display panels, for instance, display panels employing low temperature polysilicon (LTPS) TFTs. Due to the high cost of repairing the bright spots and/or dark spots, the production cost of the display panel is increased. To effectively reduce bright spots and/or dark spots in the display panel, for example, laser may be used to cut the poly-Si active layer to turn bright spot(s) into dark spot(s), but the method cannot simultaneously eliminate the dark spots; or, for example, two TFTs are arranged in one subpixel unit of the display panel, and when one is damaged, the other spare TFT operates when this one is repaired, to reduce the bright spots and/or dark spots in the display panel. As one sub-pixel unit is provided with two TFTs, the aperture ratio of the display panel and the display effect of the display panel are decreased.

At least one embodiment of the present disclosure provides a TFT, which comprises an active layer, a gate electrode, a first source/drain electrode and a second source/drain electrode. The active layer includes a first channel region and a second channel region provided in pair, a first source/drain area between the first channel region and the second channel region, and a second source/drain area opposite to the first source/drain area through the first channel region or the second channel region. The gate electrode includes a first gate electrode and a second gate electrode, in which the first gate electrode and the second gate electrode are respectively overlapped with the first channel region and the second channel region. The first source/drain electrode and the second source/drain electrode are respectively electrically connected with the first source/drain area and the second source/drain area of the active layer.

In the TFT provided by the embodiment, the first gate electrode and the second gate electrode are electrically connected in parallel, and when one gate electrode of the double-gate electrodes fails, the other gate electrode can work normally. In this way, the defect of bright spots and/or dark spots in the display panel can be effectively reduced.

Description will be given below with reference to several exemplary embodiments. Detailed description of known functions and known components has been omitted for clear and simple description of the embodiments of the present disclosure. When any component in the embodiment of the present disclosure presents in more than one accompanying drawings, the component may be represented by a same reference numeral in each accompanying drawing.

Figure 2A:
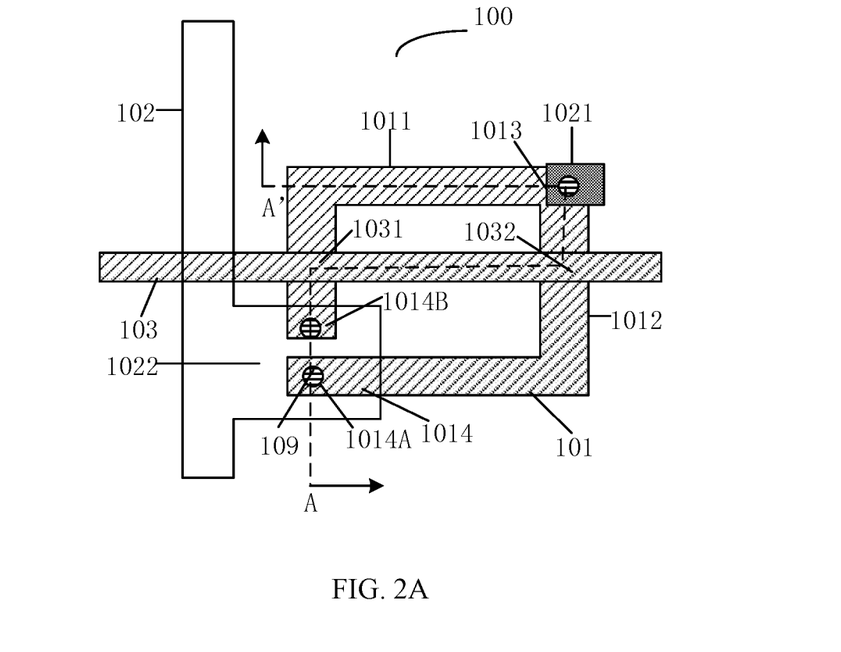
FIG. 2A is a schematically structural plan view 1 of a TFT provided by an embodiment of the present disclosure.
Figure 2B:
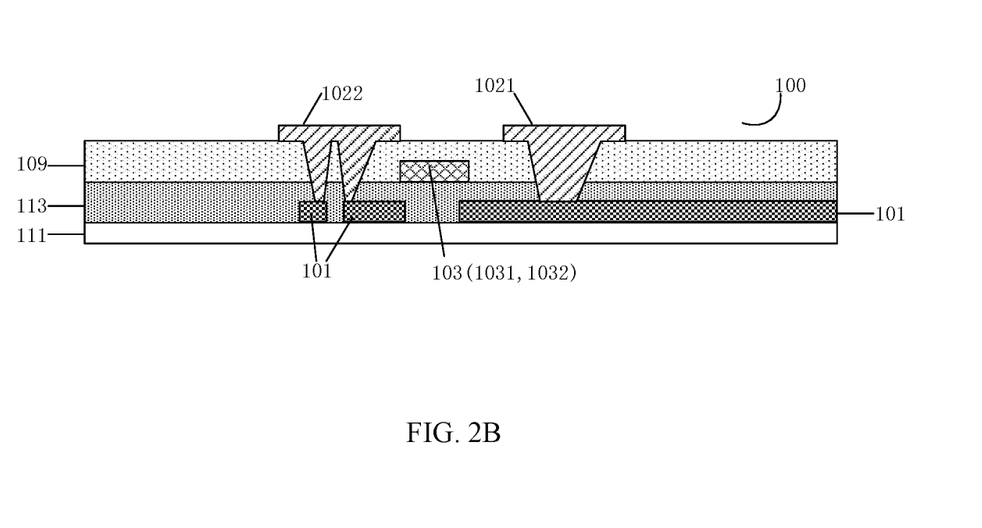
FIG. 2B is a schematically structural cross-section view of the TFT cutaway along the A-A' line in FIG. 2A.

An embodiment provides a thin film transistor (TFT) 100. FIG. 2A is a schematic plan view of the TFT provided by the embodiment of the present disclosure. FIG. 2B is a schematically structural sectional view of the TFT cutaway along the A-A' line in FIG. 2A.

As shown in FIGS. 2A and 2B, the TFT 100 comprises an active layer 101, a first gate electrode 1031, a second gate electrode 1032, a first source/drain electrode 1021 and a second source/drain electrode 1022.

As shown in FIGS. 2A and 2B, the active layer 101 includes a first channel region 1011, a second channel region 1012, a first source/drain area 1013 and a second source/drain area 1014. For instance, in the embodiment, the first channel region 1011 and the second channel region 1012 are provided in pair, the first source/drain area 1013 is between the first channel region 1011 and the second channel region 1012; and the second source/drain area 1014 is arranged opposite to the first source/drain area 1013 through the first channel region 1011 or the second channel region 1012.

In the embodiment, the active layer 101 formed by the first channel region 1011, the second channel region 1012, the first source/drain area 1013 and the second source/drain area 1014 may be a pattern with an opening and may also be a closed pattern. In the embodiment, the active layer 101 as shown in FIG. 2A is a pattern with an opening. As shown in FIG. 2A, an opening with a given size is formed between the first channel region 1011 and the second channel region 1012. When the active layer 101 is an opening pattern, for instance, the second source/drain area 1014 may include a first sub-source/drain area 1014A and a second sub-source/drain area 1014B. For instance, the first sub-source/drain area 1014A is disposed at an opening end near the second channel region 1012, and the second sub-source/drain area 1014B is disposed at an opening end near the first channel region 1011. At this point, the second source/drain electrode 1022, for instance, is respectively electrically connected with the first sub-source/drain area 1014A and the second sub-source/drain area 1014B of the active layer 101 via through holes. In the embodiment, the opening size of the active layer 101, for instance, may be correspondingly adjusted according to product design requirements. The closed pattern, for instance, may be a circle or a polygon, in which the polygon may be a regular polygon, e.g., a rectangle; or the closed pattern, for instance, may also be an irregular polygon.

As shown in FIGS. 2A and 2B, in the embodiment, the active layer 101, for instance, may include poly-Si materials, and when the TFT is applied to a display panel, for instance, a low temperature polysilicon (LTPS) TFT display panel or a high-temperature polysilicon (HTPS) TFT display panel may be formed, however, the embodiment includes but not limited thereto. For instance, the active layer 101 may also include other silicon material(s) (e.g., amorphous silicon (a-Si)), metal oxide semiconductor material(s) (e.g., indium gallium zinc oxide (IGZO)) or any other suitable materials.

As shown in FIGS. 2A and 2B, the first source/drain electrode 1021 is electrically connected with the first source/drain area 1013 of the active layer 101, and the second source/drain electrode 1022 is electrically connected with the second source/drain area 1014 of the active layer 101. In the embodiment, the first source/drain electrode 1021, for instance, may be a drain electrode, and the second source/drain electrode 1022, for instance, may be a source electrode; or the first source/drain electrode 1021, for instance, may be a source electrode, and the second source/drain electrode 1022, for instance, may be a drain electrode. When the active layer 101 is a pattern with an opening, the second source/drain electrode 1022, for instance, may be respectively electrically connected with the first sub-source/drain area 1014A and the second sub-source/drain area 1014B via through holes. The example of the material of the first source/drain electrode 1021 and the second source/drain electrode 1022 includes aluminum, aluminum alloy, copper, copper alloy or other suitable materials.

As shown in FIGS. 2A and 2B, the first gate electrode 1031 and the second gate electrode 1032 are respectively insulated from and overlapped with the first channel region 1011 and the second channel region 1012 of the active layer 101. For instance, the first gate electrode 1031 and the second gate electrode 1032 may be electrically insulated from the active layer 101 through a gate insulating layer 113 (which is described later in this text). In the embodiment, in cooperation with the design of the active layer 101, the first gate electrode 1031 and the second gate electrode 1032 realize electrical connection in parallel. For instance, the function of the TFT can be realized by the first gate electrode 1031, the first source/drain electrode 1021, the second source/drain electrode 1022 and the active layer 101; or the function of the TFT can also be realized by the second gate electrode 1032, the first source/drain electrode 1021, the second source/drain electrode 1022 and the active layer 101. In this way, the TFT provided by the embodiment is configured to be a TFT 100 in which two gate electrodes are provided in a connection in parallel and each gate electrode can operate independently, so when one gate electrode in the two gate electrodes of the TFT 100 fails, the other one can work normally.

In the embodiment, the example of the material of the first gate electrode 1031 and the second gate electrode 1032 includes aluminum, aluminum alloy, copper or other suitable materials.

For instance, as shown in FIGS. 2A and 2B, the TFT 100 further includes a gate insulating layer 113 and an interlayer insulating layer 109.

For instance, the gate insulating layer 113 is disposed between the active layer 101 and the first gate electrode 1031 and the second gate electrode 1032, so that the active layer 101 can be insulated from the first gate electrode 1031 and the second gate electrode 1032. In the embodiment, the example of the material of the gate insulating layer 113 includes SiNx, SiOx or other suitable materials.

For instance, the interlayer insulating layer 109 is disposed between the active layer 101 and the first source/drain electrode 1021 and the second source/drain electrode 1022, and covers the first gate electrode 1031 and the second gate electrode 1032. The first source/drain electrode 1021, for instance, is electrically connected with the first source/drain area 1013 of the active layer 101 via a through hole in the interlayer insulating layer 109, and the second source/drain electrode 1022 is electrically connected with the second source/drain area 1014 of the active layer 101 via a through hole in the interlayer insulating layer 109. In the embodiment, the example of the material of the interlayer insulating layer 109 includes SiNx, SiOx or other suitable materials.

Figure 2C:
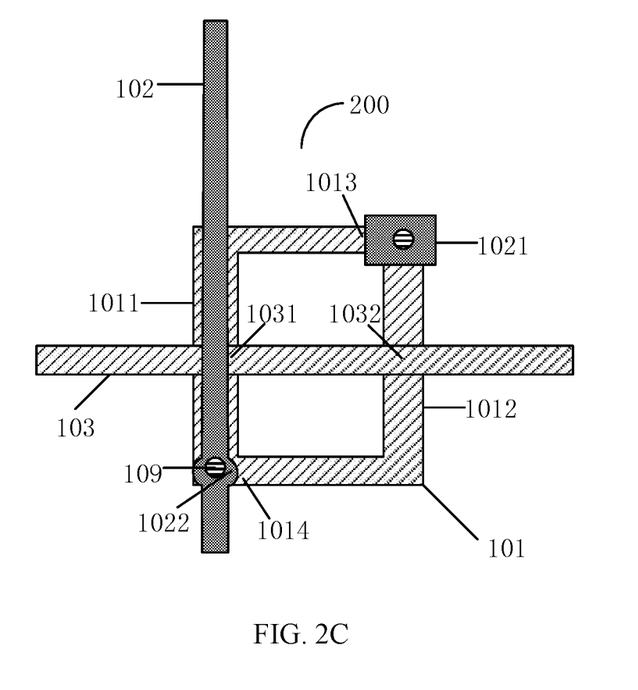
FIG. 2C is a schematically structural plan view 2 of the TFT provided by the embodiment of the present disclosure.

FIG. 2C is a schematically structural plan view of a TFT 200 in another example of the embodiment. The schematically structural cross-section view of the TFT may refer to FIG. 2A.

As shown in FIG. 2C, except for the shape of the active layer 101, the structure of the TFT in the example is basically the same as the structure of the TFT as shown in FIG. 2A. In the example, the active layer 101 is a closed pattern, for instance, a rectangle. At this point, the first source/drain area 1013 and the second source/drain area 1014 are respectively disposed between the first channel region and the second channel region; the first source/drain electrode 1021 is electrically connected with the first source/drain area 1013; and the second source/drain electrode 1022 is electrically connected with the second source/drain area 1014. In this way, the first channel region 1011 and the second channel region 1012 form a connection in parallel and may be respectively combined with a corresponding gate electrode and operate independently.

Figure 2D:
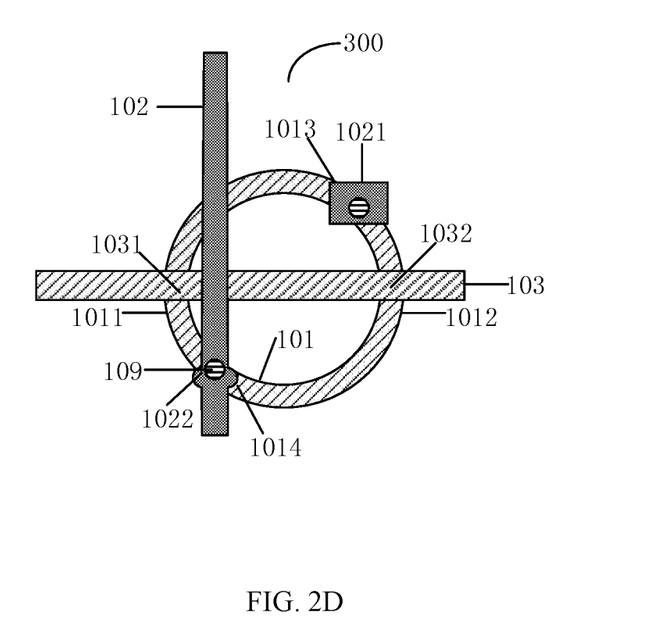
FIG. 2D is a schematically structural plan view 3 of the TFT provided by the embodiment of the present disclosure.

FIG. 2D is a schematically structural view of a TFT 300 in yet another example of the embodiment. The schematically structural cross-section view of the TFT may refer to FIG. 2A.

As shown in FIG. 2D, except for the shape of the active layer 101, the structure of the TFT in the example is basically the same as the structure of the TFT as shown in FIG. 2C. In the example, the active layer 101 is a closed pattern, for instance, a circle. In the example, the first channel region 1011 and the second channel region 1012 are arranged oppositely on the two cambered sides of the active layer 101; the first source/drain area 1013 is disposed between the first channel region 1011 and the second channel region 1012; and the second source/drain area 1014 is disposed between the first channel region 1011 and the second channel region 1012 and arranged opposite to the first source/drain area 1013. The first source/drain electrode 1021 is electrically connected with the first source/drain area 1013, and the second source/drain electrode 1022 is electrically connected with the second source/drain area 1014. In this way, the first channel region 1011 and the second channel region 1012 form a connection in parallel and may be respectively combined with a corresponding gate electrode and work independently.

Figure 2E:
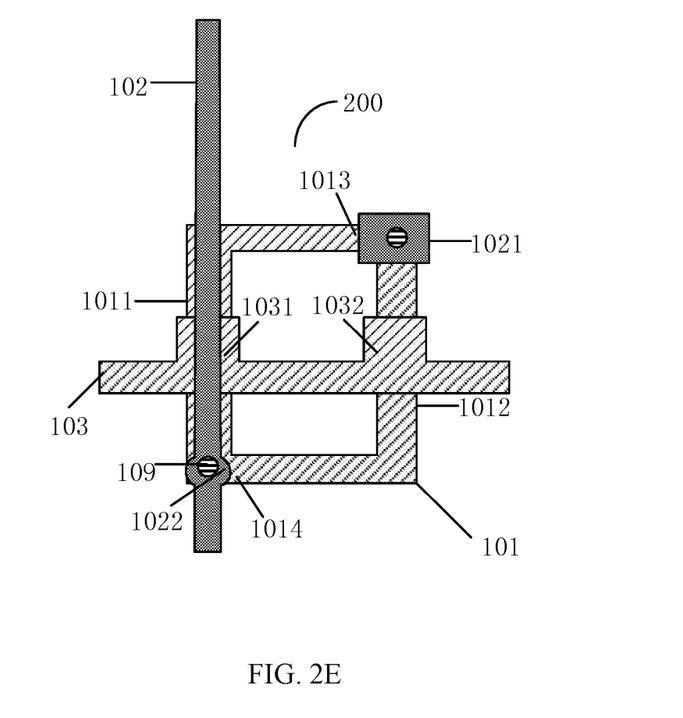
FIG. 2E is a schematically structural plan view 4 of the TFT provided by the embodiment of the present disclosure.

It is noted that: in the embodiment, the TFT as shown in FIGS. 2A and 2B is a top-gate structure, however, the embodiment includes but not limited thereto. For instance, the TFT may be a bottom-gate structure, for example, the gate electrode is formed under the active layer. In addition, in FIGS. 2A, 2C and 2D, the first gate electrode 1031 and the second gate electrode 1032 are a part of a main body of a same transversely extended gate line 103 (which is described later in this test), however, the embodiment is not limited to this structure. For instance, the first gate electrode 1031 and the second gate electrode 1032 may be a same branch electrode portion branched from the main body of the gate line 103, or as shown in FIG. 2E, may be respectively different branch electrode portions branched from the main body of the gate line 103.

Figure 3A:
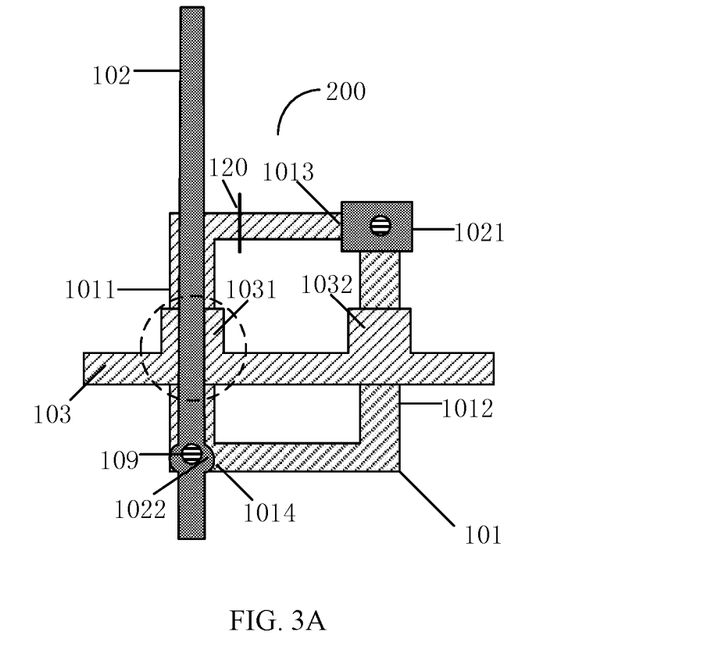
FIG. 3A is a schematic diagram illustrating a TFT which can improve bright and dark spots in a display panel provided by the embodiment of the present disclosure.
Figure 3B:
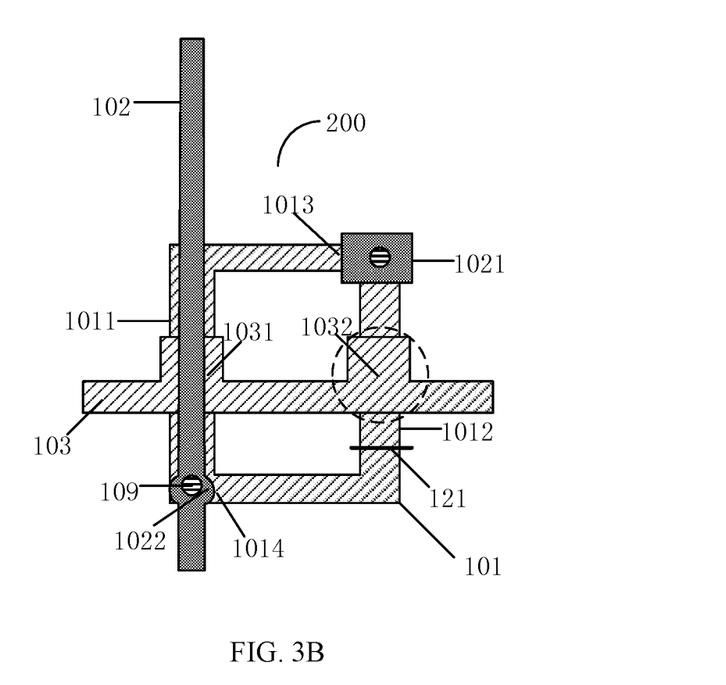
FIG. 3B is another schematic diagram illustrating the TFT which can improve the bright and dark spots in the display panel by the embodiment of the present disclosure.

FIG. 3A is a schematic diagram illustrating the TFT which can improve bright and dark spots in a display panel provided by the embodiment of the present disclosure. FIG. 3B is another schematic diagram illustrating the TFT which can improve bright and dark spots in a display panel provided by the embodiment of the present disclosure.

For instance, as shown in FIG. 3A, if the first gate electrode 1031 fails (for instance, a failure happens at a position showed by a dotted line circle in FIG. 3A), for instance, if one end of the gate electrode in the TFT is broken or the active layer is broken, at this point, as the second gate electrode 1032 can work normally, the function of the TFT can be realized by the second gate electrode 1032, the first source/drain electrode 1021, the second source/drain electrode 1022 and the active layer 101, the dark spot defect in the display panel can be avoided. For instance, if a portion of the gate insulating layer 113 is missing or there are interlayer foreign matters between the first gate electrode 1031 and the active layer 101 in the manufacturing process, the first gate electrode 1031 and the active layer 101 will be conducted, resulting in the failure of the switching function of the first gate electrode 1031 (for instance, a failure happens at the position shown by the dotted line circle in FIG. 3A). At this point, for instance, the active layer 101 at a position corresponding to the first gate electrode 1031 may be cut off by laser. For instance, the active layer 101 is cut off along a black solid line 120 in FIG. 3A. As the second gate electrode 1032 is kept in connection with the gate line and it can work normally, at this point, the function of the TFT can still be realized by the second gate electrode 1032, the first source/drain electrode 1021, the second source/drain electrode 1022 and the active layer 101, the bright spot defect in the display panel can be avoided.

For instance, as shown in FIG. 3B, if the second gate electrode 1032 fails (for instance, a failure happens at a position shown by a dotted line circle in FIG. 3B), for instance, if one end of the gate electrode of the TFT is broken or the active layer is broken, at this point, as the first gate electrode 1031 is kept in connection with the gate line and can work normally, the function of the TFT can be realized by the first gate electrode 1031, the first source/drain electrode 1021, the second source/drain electrode 1022 and the active layer 101, the dark spot defect in the display panel can be avoided. For instance, if a portion of the gate insulating layer 113 is missing or there are interlayer foreign matters between the second gate electrode 1032 and the active layer 101 in the manufacturing process, the second gate electrode 1032 and the active layer 101 will be conducted, resulting in the failure of the switching function of the second gate electrode 1032 (for instance, a failure happens at the position shown by the dotted line circle in FIG. 3B). At this point, for instance, the active layer 101 at a position corresponding to the second gate electrode 1032 may be cut off by laser, for instance, the active layer 101 is cut off along a black solid line 121 in FIG. 3B. As the first gate electrode 1031 can work normally, at this point, the function of the TFT can be realized by the first gate electrode 1031, the first source/drain electrode 1021, the second source/drain electrode 1022 and the active layer 101, the bright spot defect in the display panel can be avoided.

In the embodiment in cooperation with the design of the active layer 101, the first gate electrode 1031 and the second gate electrode 1032 can be electrical connected in parallel. If one gate electrode in the two gate electrodes fails, the other gate electrode can still work normally, the bright spot and/or dark spot defect in the display panel can be effectively reduced.

Figure 4A:
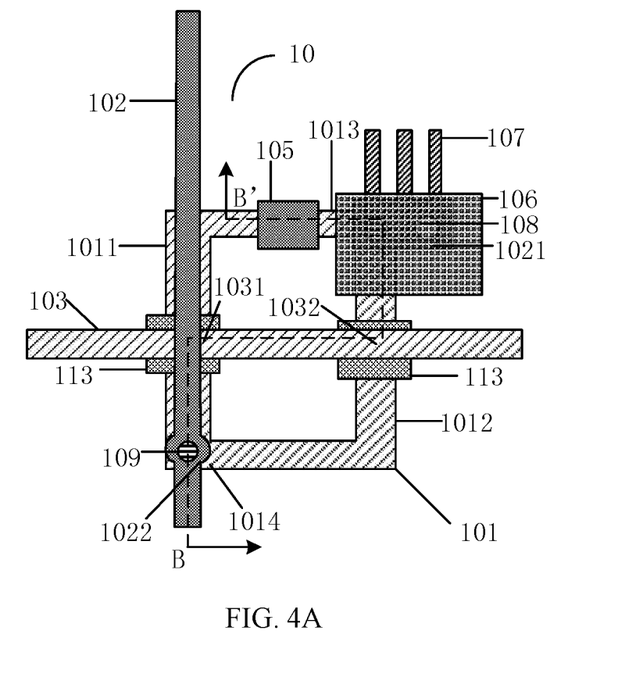
FIG. 4A is a schematically structural plan view of an array substrate provided by another embodiment of the present disclosure.
Figure 4B:
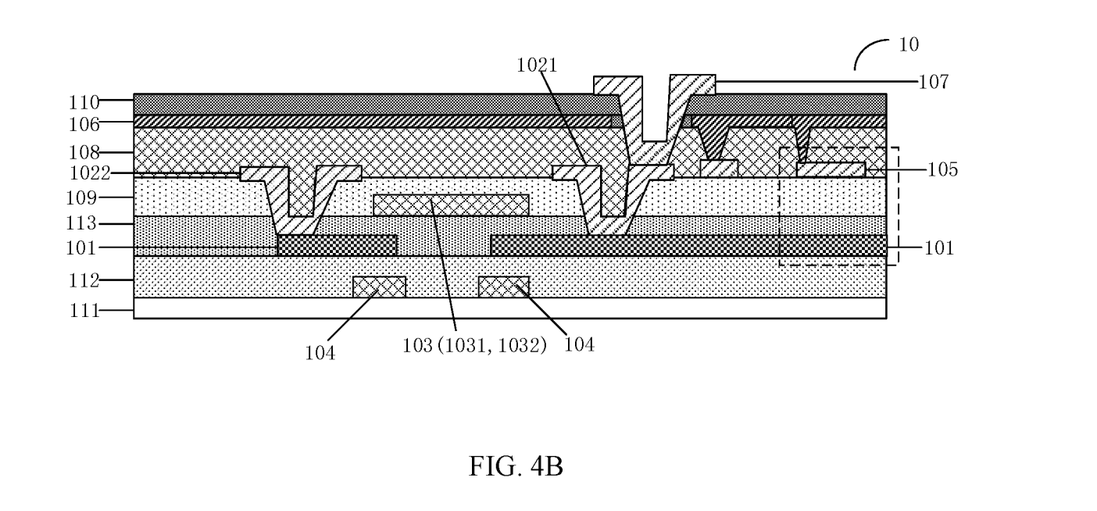
FIG. 4B is a schematically structural sectional view of the array substrate cutaway along the B-B' line in FIG. 4A.

An embodiment of the present application also provides an array substrate 10, which comprises the TFT structure provided by any embodiment of the present disclosure. FIG. 4A is a schematically structural plan view of an array substrate provided by the embodiment. FIG. 4B is a schematically structural sectional view of the array substrate cutaway along the B-B' line in FIG. 4A. For instance, the array substrate 10 may be various types of array substrates, for instance, a vertical electrical field type array substrate or a horizontal electrical field type array substrate, etc.

For instance, as shown in FIGS. 4A and 4B, for a horizontal electrical field type array substrate, the array substrate 10 comprises structures, such as TFTs, a metal layer 105, common electrodes 106 and pixel electrodes 107. For instance, in the array substrate 10, the TFT acts as a switch. Under the control of the gate electrode, an external data signal, for instance, may charge and discharge the pixel electrode 107 in the array substrate 10 through the TFT.

As shown in FIGS. 4A and 4B, the common electrode 106, for instance, may be disposed above the first source/drain electrode 1021 and the second source/drain electrode 1022. The example of the material of the common electrode 106 includes aluminum, aluminum alloy, copper or other suitable materials.

The pixel electrode 107, for instance, is disposed above the first source/drain electrode 1021 and the second source/drain electrode 1022, and is electrically connected with the second source/drain electrode 1022, and the embodiment includes but not limited thereto. For instance, the pixel electrode 107 may also be electrically connected with the first source/drain electrode 1021. In the embodiment, the pixel electrode 107 and the common electrode 106 may form two electrodes of a first capacitor (namely a liquid crystal capacitor configured to form an electrical field for driving the deflection of liquid crystal molecules). When the gate electrode of the TFT is switched on, an external voltage signal received by a data line 102 (which is mentioned later in this text) is inputted into the corresponding first capacitor through the TFT, namely charging the first capacitor, so as to realize the writing and holding of the signal voltage of a corresponding pixel of the pixel electrode 107. The example of the material of the pixel electrode 107 includes molybdenum, molybdenum alloy, titanium, titanium alloy, ITO, IZO or other suitable materials.

It is noted that in the embodiment, the common electrode 106 and the pixel electrode 107 are arranged in different layers so as to obtain, for instance, a Fringe Field Switching (FFS) or an Advanced Super Dimension Switch (ADS) array substrate, however, the embodiment includes but not limited thereto. For instance, the common electrode 106 and the pixel electrode 107 may be arranged in a same layer, so as to form an In-Plane Switching (IPS) array substrate.

As shown in FIGS. 4A and 4B, the metal layer 105, for instance, may be arranged in a same layer as the first source/drain electrode 1021 and the second source/drain electrode 1022, and the metal layer 105 is electrically insulated from the active layer 101 through the interlayer insulating layer 109 and the gate insulating layer 113. The metal layer 105, for instance, may be at least partially overlapped with the active layer 101, so the metal layer 105 and the active layer 101 can form two electrodes of a second capacitor. The metal layer 105 is electrically connected with the common electrode 106 via a through hole. In this way, the second capacitor and the first capacitor form an electrical connection in parallel, so the total capacitance is increased, and the potential retention of liquid crystal pixels can be effectively improved. The example of the material of the metal layer 105 includes aluminum, aluminum alloy, copper or other suitable materials.

As shown in FIGS. 4A and 4B, the array substrate 10, for instance, may also comprise a base substrate 111, a light blocking layer 104, a buffer layer 112, a plurality of data lines 102, a plurality of gate lines 103, an insulating layer 108, a passivation layer 110 and other structures.

For instance, the base substrate 111 may be a glass substrate, a quartz substrate, a plastic substrate or a substrate made from other suitable materials.

As shown in FIGS. 4A and 4B, the light blocking layer 104, for instance, may be disposed between the base substrate 111 and the active layer 101, and the light blocking layer 104, for instance, is overlapped with at least one of the first channel region 1011 or the second channel region 1012 of the active layer 101, so as to prevent the active layer 101 from being exposed to external light to generate photo-induced carriers and causing a leakage current. The example of the material of the light blocking layer 104 includes metallic materials (e.g., silver), SiNx, SiOx or other suitable materials.

The buffer layer 112, for instance, may be disposed on the base substrate 111 and cover the light blocking layer 104. The buffer layer 112 can prevent impurity ions in the base substrate 111 from being dispersed to a subsequently formed circuit layer including the TFT and the like and affecting the properties of the TFT element, such as the threshold voltage, and the leakage current. The example of the material of the buffer layer 112 includes SiNx, SiOx or other suitable materials.

For instance, the plurality of data lines 102 and the plurality of gate lines 103 are insulated from and intersected with each other on the base substrate 111 to define subpixel units, and each subpixel unit includes at least one TFT provided by any foregoing embodiment as a switching element, the pixel electrode 107 for controlling the liquid crystal arrangement, and other structures. In the embodiment, the gate line 103 is electrically connected with both the first gate electrode 1031 and the second gate electrode 1032, and a gate signal is applied to the first gate electrode 1031 and the second gate electrode 1032 through the gate line 103. The example of the material of the gate line 103 includes aluminum, aluminum alloy, copper or other suitable materials. The example of the material of the data line 102 may be the same as or different from that of the gate line 103.

The insulating layer 108, for instance, may be disposed on the base substrate 111 and cover the gate insulating layer 113. The insulating layer 108, for instance, may include a plurality of through holes. The common electrode 106, for instance, is electrically connected with the metal layer 105 via the through hole in the insulating layer 108. The example of the material of the insulating layer 108 includes polymethyl methacrylate (PMMA) or other suitable materials.

The passivation layer 110, for instance, covers the common electrode 106 so as to protect the common electrode 106. The example of the material of the passivation layer 110 includes SiNx, SiOx or other suitable materials.

Figure 4C:
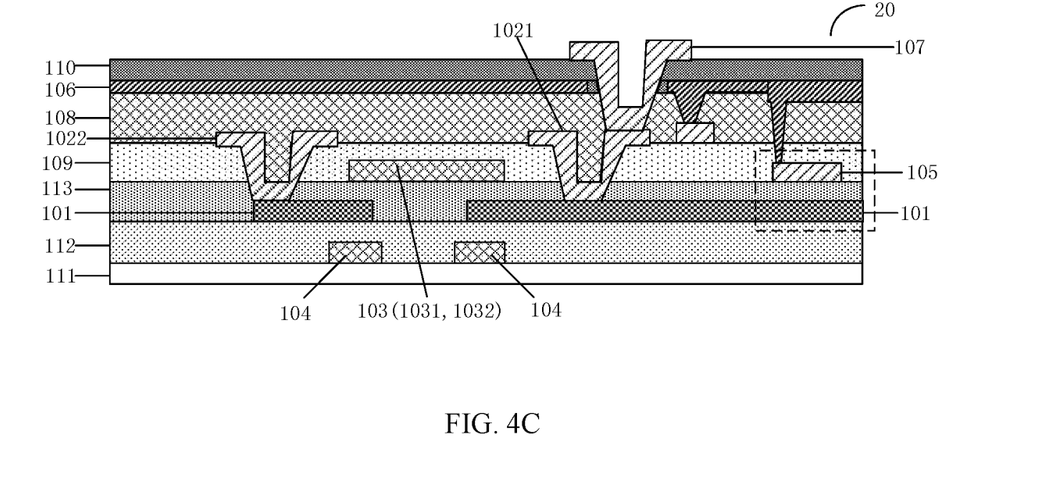
FIG. 4C is a schematically structural sectional view of another array substrate provided by the another embodiment of the present disclosure.

FIG. 4C is a schematically structural cross-section view of an array substrate 20, which is a variant of the structure as shown in FIG. 4B.

As shown in FIG. 4C, except for the position of the metal layer 105, the structure of the array substrate in the example is basically the same as the structure of the array substrate as shown in FIG. 4B. In the example, the metal layer 105, for instance, may be arranged in a same layer as the first gate electrode 1031 and the second gate electrode 1032. In the example, the common electrode 106 and the pixel electrode 107 may form two electrodes of the first capacitor. When the gate electrode of the TFT is switched on, an external voltage signal received by the data line 102 is inputted into the corresponding first capacitor through the TFT, namely charging the first capacitor, so as to realize the writing and holding of the signal voltage of a corresponding pixel of the pixel electrode 107. The metal layer 105 is electrically connected with the active layer 101 through the gate insulating layer 113, and the metal layer 105 and the active layer 101 form two electrodes of the second capacitor. The common electrode 106, for instance, is electrically connected with the metal layer 105 via a through hole. In this way, the second capacitor and the first capacitor form an electrical connection in parallel, so the total capacitance is increased, and the potential retention of liquid crystal pixels can be effectively improved.

Figure 4D:
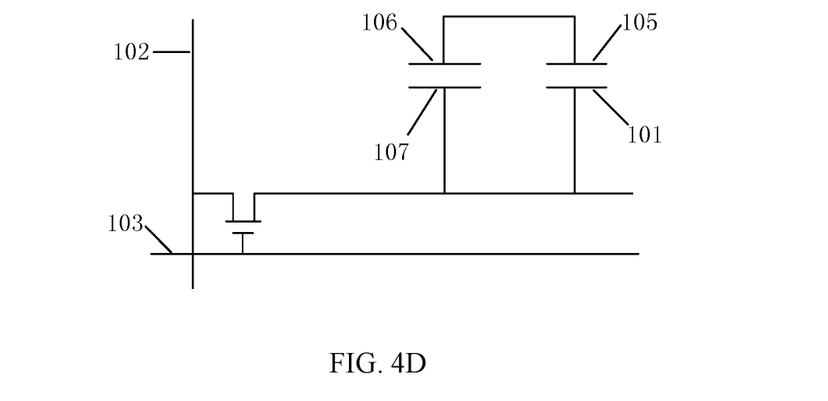
FIG. 4D is a schematic diagram illustrating the circuit connection relation between a first capacitor and a second capacitor of the array substrate provided by the another embodiment of the present disclosure.

FIG. 4D is a schematic diagram illustrating the circuit connection relation between the first capacitor and the second capacitor of the array substrate provided by the embodiment. As shown in FIG. 4D, the common electrode 106 and the pixel electrode 107 form two electrodes of the first capacitor, the active layer 101 and the metal layer 105 form two electrodes of the second capacitor, and the common electrode 106 of the first capacitor is electrically connected with the metal layer 105 of the second capacitor, so the first capacitor and the second capacitor can form an electrical connection in parallel. When there is abnormally increased leakage current in the array substrate, by connecting the second capacitor and the first capacitor in parallel, the total capacitance is increased, and the potential retention of the liquid crystal pixels can be effectively improved, and the voltage change caused by the leakage current can be greatly reduced.

It is noted that, for clarity, not all the structures of the array substrate are given in the embodiment. In order to realize necessary functions of the array substrate, other structures not shown may be set by one of ordinary skill in the art according to application scenes.

Other technical effects of the array substrate provided by the embodiment may refer to the technical effects of the TFT structure described in the embodiment. No further description is repeated here.

An embodiment of the present disclosure also provides a display device, which comprises a display panel. The display panel includes the foregoing array substrate. The technical effects of the display device may refer to the technical effects of the TFT described in the embodiment and the array substrate described in the embodiment. No further description is repeated here.

An embodiment of the present disclosure also provides a method of manufacturing an array substrate. FIGS. 5A-5F are sectional views illustrating the manufacturing processes of the array substrate provided by the embodiment.

Figure 5A:
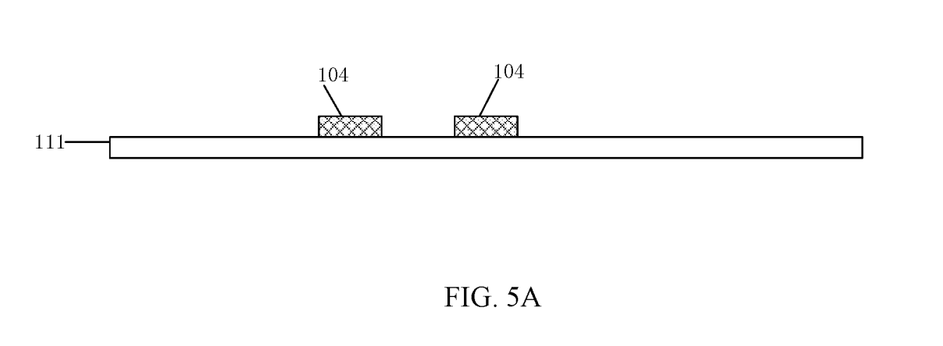
FIGS. 5A-5F are sectional views illustrating the manufacturing processes of an array substrate provided by yet another embodiment of the present disclosure.

As shown in FIG. 5a, a base substrate 111 is provided. The base substrate 111, for instance, may be a transparent insulating layer. For instance, it may be a glass substrate, a quartz substrate, a plastic substrate or other suitable materials.

A light blocking layer 104, for instance, may be formed on the base substrate 111. The example of the material of the light blocking layer 104 includes metallic materials (e.g., chromium or copper), organic materials (e.g., black resin materials) or other suitable materials. The light blocking layer 104, for instance, may be formed by a chemical vapor deposition (CVD) process, or a magnetron sputtering deposition process, and subsequently, a patterned light blocking layer 104 is formed by photolithography including processes, such as photoresist coating, exposure and development.

Figure 5B:
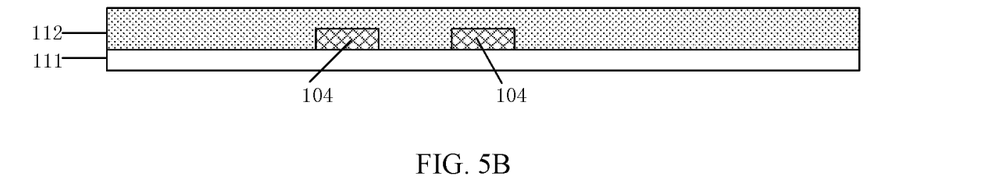

As shown in FIG. 5B, a buffer layer 112, for instance, may be formed on the base substrate 111 and cover the light blocking layer 104. The buffer layer 112 can prevent impurity ions in the base substrate 111 from being dispersed to a subsequently formed circuit layer including TFTs and the like and affecting the properties of the TFT elements, such as the threshold voltage and the leakage current. The example of the material of the buffer layer 112 includes SiNx, SiOx or other suitable materials.

Figure 5C:
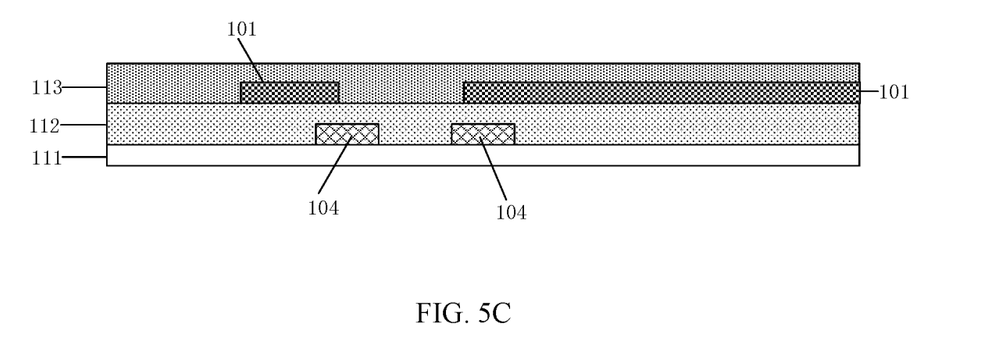

As shown in FIG. 5C, an a-Si layer, for instance, is deposited on the buffer layer 112, and a patterned active layer 101 is formed by patterning the a-Si layer by photolithography, for instance.

The operation of forming the a-Si active layer 101 by photolithography, for instance, includes: forming a photoresist layer (not shown in the figure) on the entire surface of the a-Si layer after the a-Si layer is deposited on the buffer layer 112; forming a photoresist pattern having a shape corresponding to that of the active layer 101 with required shape on the a-Si layer by patterning the photoresist layer by photolithography including exposure and development; and subsequently, forming the active layer 101 with the required shape on the buffer layer 112 by patterning the a-Si layer by adoption of the photoresist pattern as an etching mask. In the embodiment, the formed active layer 101, for instance, may be a pattern with an opening and may also be a closed pattern. The closed pattern, for instance, may be a circle or a polygon, in which the polygon may be a regular polygon, e.g., a rectangle, or an irregular polygon. For example, for an active layer 101 in a rectangle, as shown in FIG. 4A, the formed active layer 101 includes a first channel region 1011, a second channel region 1012, a first source/drain area 1013 and a second source/drain area 1014. The first channel region 1011 and the second channel region 1012 are formed in pair mode. The first source/drain area 1013 is disposed between the first channel region 1011 and the second cannel region 1012; and the second source/drain area 1014 is disposed between the first channel region 1011 and the second channel region 1012 and opposite to the first source/drain area 1013. In this way, the active layer 101 in a rectangle shape is formed by the first channel region 1011, the second channel region 1012, the first source/drain area 1013 and the second source/drain area 1014.

In the embodiment of the present disclosure, the formed active layer 101 may also be a shape with an opening. For instance, in an example of the embodiment, the active layer 101 shaped with the opening includes a first channel region 1011, a second channel region 1012, a first source/drain area 1013 and a second source/drain area 1014. The first channel region 1011 and the second channel region 1012 are formed in pair mode; the first source/drain area 1013 is disposed between the first channel region 1011 and the second channel region 1012; the second source/drain area 1014 is arranged opposite to the first source/drain area 1013 through the first channel region 1011 or the second channel region 1012; and an opening is formed with a given size between the first channel region 1011 and the second channel region. For instance, when the active layer 101 is shaped with an opening, the second source/drain area 1014 may also include a first sub-source/drain area 1014A and a second sub-source/drain area 1014B near the opening, so a subsequently formed second source/drain electrode 1021, for instance, may be respectively electrically connected with the first sub-source/drain area 1014A and the second sub-source/drain area 1014B. The opening size of the active layer 101 may be adjusted according to product design requirements.

In the embodiment, for instance, at least one of the first channel region 1011 or the second channel region 1012 of the active layer 101 is overlapped with the light blocking layer 104, so as to prevent the active layer 101 from being exposed to external light to generate photo-induced carriers and causing a leakage current.

In the embodiment, the example of the material of the active layer 101 includes a-Si, poly-Si, metal oxide semiconductor materials, such as IGZO, or any other suitable material.

When the active layer 101 includes poly-Si materials, the method for forming the poly-Si active layer 101, for instance, may include: depositing an inducible metal at a selected position (usually a position of the subsequently formed source/drain area) on the a-Si layer by a sputtering process after depositing the a-Si layer on the buffer layer 112; performing annealing processing, for instance, adopting an annealing process, such as rapid thermal annealing (RTA), excimer laser annealing (ELA), or furnace annealing. During the annealing process, a metal-induced crystallization (MIC) poly-Si area is formed when an area of the a-Si layer 101 in direct contact with the metal undergoes MIC, and subsequently, a metal-induced lateral crystallization (MILC) poly-Si area is formed when poly-Si crystal grains are laterally grown into the a-Si area not in direct contact with the metal, in which a-Si in the active layer 101 is converted into poly-Si by crystallization. A photoresist layer (not shown in the figure) is formed on the entire surface of the poly-Si active layer. The photoresist layer is patterned by photolithography including exposure and development, and a photoresist pattern having a shape corresponding to that of the active layer 101 with required shape is formed on the poly-Si layer. The patterned poly-Si active layer 101 is formed on the buffer layer 112 by patterning the poly-Si layer by adoption of the photoresist pattern as an etching mask.

As shown in FIG. 5C, after the active layer 101 is formed, a gate insulating layer 113 for covering the active layer 101, for instance, may be formed. The example of the material of the gate insulating layer 113 includes SiNx, SiOx or other suitable materials. No limitation is given here in the embodiment.

Figure 5D:
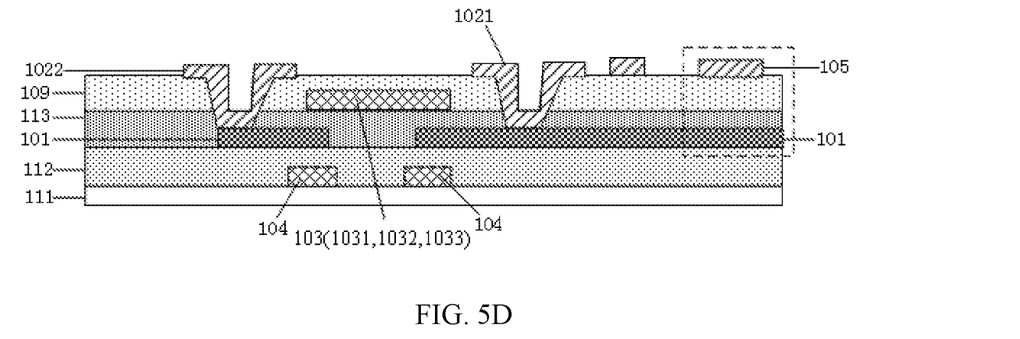

As shown in FIG. 5D, after the gate insulating layer 113 is formed, for instance, structures, such as gate line(s) 103, a first gate electrode 1031, a second gate electrode 1032, an interlayer insulating layer 109, data line(s) 102, a first source/drain electrode 1021, a second source/drain electrode 1022 and a metal layer 105 may be formed on the gate insulating layer 113.

For instance, the gate line(s) 103 is/are formed on the gate insulating layer 113 and insulated from and overlapped with both the first channel region 1011 and the second channel region 1012 of the active layer 101. The example of the material of the gate lines 103 includes aluminum, aluminum alloy, copper or other suitable materials.

For instance, in the embodiment, the first gate electrode 1031 and the second gate electrode 1032 form one part of a main body of a same transversely extended gate line 103, namely the gate line 103 is formed by the first gate electrode 1031, the second gate electrode 1032 and a main body 1033 of the gate line together, for instance, as shown in FIG. 5D. Moreover, the first gate electrode 1031 is insulated from and overlapped with the first channel region 1011 of the active layer 101, and the second gate electrode 1032 is insulated from and overlapped with the second channel region 1012 of the active layer 101. But the embodiment is not limited to the structures. For instance, the first gate electrode 1031 and the second gate electrode 1032 may be formed as a same branch electrode portion branched from the main body of the gate line 103, or as shown in FIG. 2E, may be formed respectively as different branch electrode portions branched from the main body of the gate line 103, namely forming the first gate electrode 1031 by branching at an insulated and overlapped position of the gate line 103 and the first channel region 1011 of the active layer 101, and forming the second gate electrode 1032 by branching at an insulated and overlapped position of the gate line 103 and the second channel region 1012 of the active layer 101. A gate signal is applied to the first gate electrode 1031 and the second gate electrode 1032 through the gate line 103.

For instance, as shown in FIG. 5D, the interlayer insulating layer 109 covers the gate line 103, the first gate electrode 1031 and the second gate electrode 1032. The example of the material of the interlayer insulating layer 109 includes SiNx, SiOx or other suitable materials.

For instance, as shown in FIG. 5D, after the interlayer insulating layer 109 is formed, the data line(s) 102 (not shown in the figure), the first source/drain electrode 1021, the second source/drain electrode 1022 and the metal layer 105 may be formed on the interlayer insulating layer 109.

In the embodiment, the data lines 102 and the gate lines 103 are insulated from and intersected with each other to define subpixel units, and each subpixel unit, for instance, includes at least one TFT as a switching element and described in any foregoing embodiment and a pixel electrode 107 (which is mentioned later in this text) for controlling liquid crystal arrangement. The example of the material of the data lines 102 includes aluminum, aluminum alloy, copper or other suitable materials.

For instance, the first source/drain electrode 1021, the second source/drain electrode 1022 and the metal layer 105 may be formed in a same layer, and the first source/drain electrode 1021 is formed by being branched from the data line 102. In order to form the first source/drain electrode 1021, the second source/drain electrode 1022 and the metal layer 105, a metal layer (not shown in the figure) is formed on the entire surface of the interlayer insulating layer 109. The example of the material of the metal layer includes aluminum, aluminum alloy, copper or other suitable materials. The metal layer, for instance, may be formed by a CVD or a sputtering process.

After the metal layer is formed, a photoresist layer (not shown in the figure) is formed on the entire surface of the metal layer. A photoresist pattern (not shown in the figure) is formed on the metal layer by patterning the photoresist layer by photolithography including exposure and development processes. The first source/drain electrode 1021, the second source/drain electrode 1022 and the metal layer 105 are formed on the interlayer insulating layer 109 by patterning the metal layer by adoption of the photoresist pattern as an etching mask.

For instance, the first source/drain electrode 1021 may be electrically connected with the first source/rain area 1013 of the active layer 101, and the second source/drain electrode 1022 may be electrically connected with the second source/drain area 1014 of the active layer 101. In the embodiment, the first source/drain electrode 1021, for instance, may be a drain electrode, and the second source/drain electrode 1022, for instance, may be a source electrode; or the first source/drain electrode 1021, for instance, may be a source electrode, and the second source/drain electrode 1022, for instance, may be a drain electrode. When the active layer 101 is an opening pattern, for instance, the second source/drain area 1014 may also include a first sub-source/drain area 1014A and a second sub-source/drain area 1014B. The second source/drain electrode 1022 is respectively electrically connected with the first sub-source/drain electrode 1014A and the second sub-source/drain electrode 1014B via through holes. The metal layer 105 is electrically insulated from the active layer 101 through the interlayer insulating layer 109 and the gate insulating layer 113. The metal layer 105 is at least partially overlapped with the active layer 101.

It is noted that in the embodiment, the position of the metal layer 105 includes but not limited thereto. For instance, the metal layer 105 may be formed in a same layer as the first gate electrode 1031 and the second gate electrode 1032. The metal layer 105 is electrically insulated from the active layer 101 by the gate insulating layer 113.

Figure 5E:
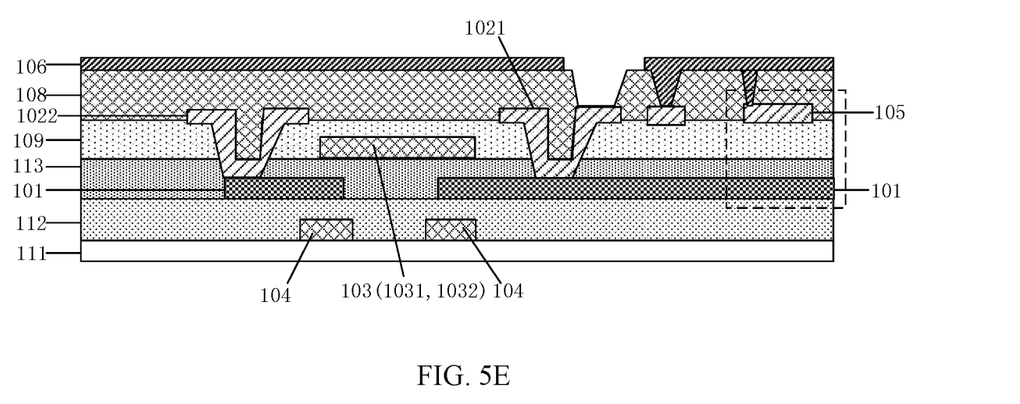

As shown in FIG. 5E, an insulating layer 108, for instance, may be formed on the first source/drain electrode 1021, the second source/drain electrode 1022 and the metal layer 105; and a plurality of through holes are formed in the insulating layer 108 by photolithography. The example of the material of the insulating layer 108 includes inorganic insulating materials, organic insulating materials (e.g., acrylic resin) or other suitable materials.

As shown in FIG. 5E, a common electrode 106, for instance, may be formed on the insulating layer 108 and is electrically connected with the metal layer 105 via the through hole in the insulating layer 108. The example of the material of the common electrode 106 includes aluminum, aluminum alloy, copper, copper aluminum, indium tin oxide (ITO) or other suitable materials.

Figure 5F:
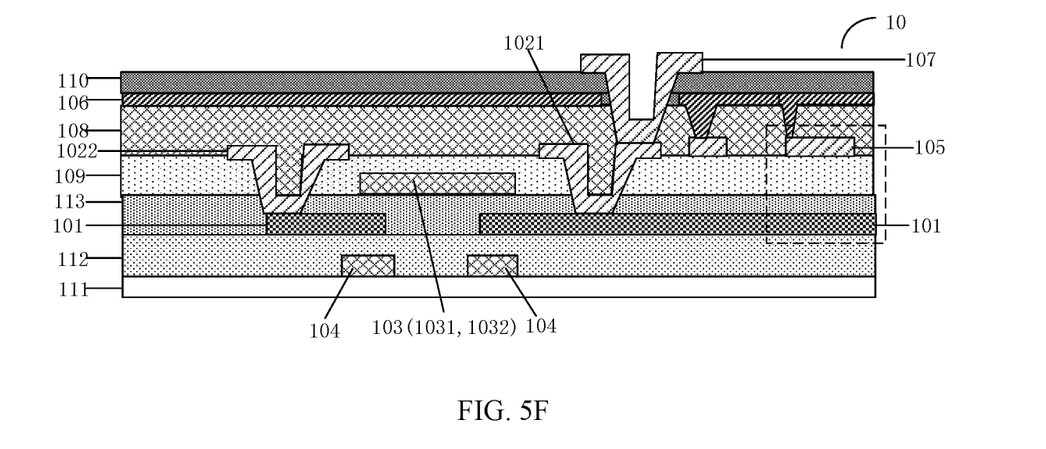

As shown in FIG. 5F, a passivation layer 110, for instance, may be formed on the common electrode 106 so as to protect the common electrode 106. The example of the material of the passivation layer 110 includes SiNx, SiOx or other suitable materials.

As shown in FIG. 5F, a pixel electrode 107, for instance, may be formed on the passivation layer 110. The pixel electrode 107 is formed by patterning the metal layer by the same photolithography process of forming the first source/drain electrode 1021 and the second source/drain electrode 1022 as described above. The pixel electrode 107, for instance, may be electrically connected with the second source/drain electrode 1022, however, the embodiment includes but not limited thereto. For instance, the pixel electrode 107 may be electrically connected with the first source/drain electrode 1021. The pixel electrode 107 and the common electrode 106 may form two electrodes of a first capacitor, respectively. When the gate electrode of the TFT is switched on, an external voltage signal received by the data line 102 is inputted into the corresponding first capacitor through the TFT, namely charging the first capacitor, so as to realize the writing and holding of the signal voltage of a corresponding pixel of the pixel electrode 107. As the metal layer 105 is at least partially overlapped with and insulated from the active layer 101, the metal layer 105 and the active layer 101 may form two electrodes of a second capacitor, respectively. The common electrode 106, for instance, may be electrically connected with the metal layer 105 via a through hole. In this way, the second capacitor and the first capacitor form an electrical connection in parallel, so the total capacitance is increased, and the potential retention of liquid crystal pixels can be effectively improved. The example of the material of the pixel electrode 107 includes aluminum, aluminum alloy, molybdenum, molybdenum alloy, ITO, indium zinc oxide (IZO) or other suitable materials.

It is noted that in the embodiment, the common electrode 106 and the pixel electrode 107 are formed in different layers, however, the embodiment includes but not limited thereto. For instance, the common electrode 106 and the pixel electrode 107 may be formed in a same layer.

It is noted that, in the embodiment, the formed TFT is a top-gate structure, however, the embodiment includes but not limited thereto. For instance, the TFT may be a bottom-gate structure, for instance, the active layer is formed above the gate electrode.

In the embodiment, in cooperation with the design of the active layer 101, the first gate electrode 1031 and the second gate electrode 1032 realize an electrical connection in parallel. That is to say, the function of the TFT can be realized by the first gate electrode 1031, the first source/drain electrode 1021, the second source/drain electrode 1022 and the active layer 101; or the function of the TFT can be realized by the second gate electrode 1032, the first source/drain electrode 1021, the second source/drain electrode 1022 and the active layer 101. When one gate electrode of the double-gate electrodes fails, the other gate electrode can keep working normally, so the bright spot/dark spot defect in the display device can be effectively reduced. In addition, in the embodiment, the common electrode 106 and the pixel electrode 107 form the two electrodes of the first capacitor, respectively; the active layer 101 and the metal layer 105 form the two electrodes of the second capacitor, respectively; and the common electrode 106 is electrically connected with the metal layer 105, so the first capacitor and the second capacitor form an electrical connection in parallel. When there is abnormally increased leakage current in the array substrate, by providing the first capacitor and the second capacitor connected in parallel, the total capacitance is increased, and the potential retention of liquid crystal pixels can be effectively improved, and the voltage change caused by the leakage current can be greatly reduced.

It is noted that, for clarity, not all of the structures of the array substrate and display device are given in the embodiment. In order to realize necessary functions of the array substrate and the display device, other structures not shown may be provided by one of ordinary skill in the art according to application scenes.

The following points is noted:

(1) The accompanying drawings of the embodiments of the present disclosure only involve structures relevant to the embodiments of the present disclosure, and other structures may refer to a common design.

(2) For clarity, in the accompanying drawings of the present disclosure, the thickness of layers or regions is enlarged or shrunk, namely these accompanying drawings are not drawn according to actual scale. It is to be understood that when an element, such as a layer, a film, a region or a substrate is referred to be disposed 'on,' 'above' or 'under' another element, the element may be "directly" disposed "on" or "under" another element, or an intermediate element may be provided.

(3) Without conflict with each other, the embodiments of the present disclosure and the characteristics in the embodiments may be combined to obtain new embodiments.

The foregoing is only the exemplary embodiments of the present disclosure, and the scope of the present disclosure is not limited thereto. A person of ordinary skill in the art can make various changes and modifications without departing from the spirit of the present disclosure, and such changes and modifications shall fall into the scope of the present disclosure.

What is claimed is:

1. A thin-film transistor (TFT), comprising:
    an active layer including a first channel region and a second channel region, a first source/drain area between the first channel region and the second channel region, and a second source/drain area opposite to the first source/drain area through the first channel region or the second channel region;

a gate electrode including a first gate electrode and a second gate electrode, wherein the first gate electrode and the second gate electrode are respectively overlapped with the first channel region and the second channel region, and the first gate electrode and the second gate electrode are electrically connected; and a first source/drain electrode and a second source/drain electrode being respectively electrically connected with the first source/drain area and the second source/drain area of the active layer.

2. The TFT according to claim 1, wherein the second source/drain area includes a first sub-source/drain area and a second sub-source/drain area; and the second source/drain electrode is electrically connected with both the first sub-source/drain area and the second sub-source/drain area.

3. The TFT according to claim 1, further comprising an interlayer insulating layer, wherein the interlayer insulating layer is provided between the active layer and the first source/drain electrode and the second source/drain electrode and provided with a plurality of through holes for the first source/drain electrode and the second source/drain electrode to be respectively electrically connected with the active layer.

4. The TFT according to claim 1, wherein
the active layer is a closed pattern; and the second source/drain area is provided between the first channel region and the second channel region.

5. The TFT according to claim 4, wherein the closed pattern is a circle or a polygon.

6. The TFT according to claim 5, wherein the polygon is a rectangle.

7. The TFT according to claim 1, wherein the active layer includes material of polycrystalline silicon (poly-Si).

8. The TFT according to claim 1, wherein the first gate electrode and the second gate electrode are a same structure.

9. The TFT according to claim 1, wherein the TFT adopts top-gate or bottom-gate type.

10. An array substrate, comprising the thin film transistor (TFT) according to claim 1.

11. The array substrate according to claim 10, further comprising:
a pixel electrode electrically connected with one of the first source/drain electrode and the second source/drain electrode; and
a common electrode which forms two electrodes of a first capacitor together with the pixel electrode.

12. The array substrate according to claim 11, wherein the common electrode and the pixel electrode are in different layers.

13. The array substrate according to claim 11, further comprising:
a metal layer provided in a same layer as the first source/drain electrode and the second source/drain electrode or the gate electrode, the metal layer being at least partially overlapped with the active layer and configured to form two electrodes of a second capacitor together with the active layer.

14. The array substrate according to claim 13, wherein the metal layer is electrically connected with the common electrode.

15. The array substrate according to claim 10, further comprising:
a light blocking layer at least overlapped with at least one of the first channel region and the second channel region of the active layer.

16. A display device, comprising the array substrate according to claim 10.

17. A method for manufacturing an array substrate, comprising:
forming an active layer, in which the active layer includes a first channel region and a second channel region, a first source/drain area between the first channel region and the second channel region, and a second source/drain area opposite to the first source/drain area through the first channel region or the second channel region;
forming a gate electrode, wherein the gate electrode includes a first gate electrode and the second gate electrode respectively overlapped with the first channel region and the second channel region, and the first gate electrode and the second gate electrode are electrically connected; and
forming a first source/drain electrode and a second source/drain electrode, in which the first source/drain electrode and the second source/drain electrode are respectively connected with the first source/drain area and the second source/drain area of the active layer.

18. The method for manufacturing the array substrate according to claim 17, wherein
the active layer is a closed pattern; and the second source/drain area is formed between the first channel region and the second channel region.

19. The method for manufacturing the array substrate according to claim 17, further comprising:
forming a pixel electrode electrically connected with one of the first source/drain electrode and the second source/drain electrode; and
forming a common electrode which form two electrodes of a first capacitor together with the pixel electrode.

20. The method for manufacturing the array substrate according to claim 19, further comprising:
forming a metal layer, in which
the metal layer is simultaneously formed with the first source/drain electrode and the second source/drain electrode or the gate electrode, the metal layer is at least partially overlapped with the active layer and forms two electrodes of a second capacitor together with the active layer.

* * * * *